(12) United States Patent
Oktem et al.

(10) Patent No.: US 6,624,769 B2
(45) Date of Patent: Sep. 23, 2003

(54) APPARATUS, AND ASSOCIATED METHOD, FOR COMMUNICATING CONTENT IN A BANDWIDTH-CONSTRAINED COMMUNICATION SYSTEM

(75) Inventors: Levent Oktem, Sunnyvale, CA (US); Tolga K. Capin, Fort Worth, TX (US)

(73) Assignee: Nokia Corporation, Espoo (FI)

(*) Notice: Subject to any disclaimer, the term of this patent is extended or adjusted under 35 U.S.C. 154(b) by 0 days.

(21) Appl. No.: 10/007,088

(22) Filed: Dec. 6, 2001

(65) Prior Publication Data

US 2003/0038738 A1 Feb. 27, 2003

Related U.S. Application Data

(60) Provisional application No. 60/287,254, filed on Apr. 27, 2001.

(51) Int. Cl.$^7$ ................................. H03M 7/30
(52) U.S. Cl. ........................... 341/87; 341/51
(58) Field of Search .................... 341/51, 87

(56) References Cited

U.S. PATENT DOCUMENTS

| | | | |
|---|---|---|---|
| 4,700,175 A | 10/1987 | Bledsoe | 340/347 |
| 5,892,847 A * | 4/1999 | Johnson | 382/232 |
| 6,263,313 B1 | 7/2001 | Milsted et al. | 705/1 |
| 6,309,424 B1 | 10/2001 | Fallon | 341/51 |
| 2001/0050685 A1 * | 12/2001 | Simons | 345/475 |

FOREIGN PATENT DOCUMENTS

WO    WO 99-37095    *   7/1999    ............ H04N/7/26

OTHER PUBLICATIONS

Alves dos Santos, *Multimedia Data and Tools for Web Services over Wireless Platforms,* IEEE, IEEE Personal Communications vol. 5, No. 5, Oct. 1998, pp. 42–46.*

* cited by examiner

*Primary Examiner*—Howard L. Williams
(74) *Attorney, Agent, or Firm*—Steven A. Shaw; Federico Fraccaroli; Scheef & Stone, LLP

(57) ABSTRACT

Apparatus, and an associated method, for facilitating communication of a vector graphic representation, or other content, pursuant to effectuation of a communication service. The content forms, for instance, an animated graphic, such as that used in a mobile communication application to effectuate an animated multi-media message. The vector graphic is encoded according to codewords that function to compress the data prior to its communication upon a radio link. And, once delivered to a receiving station, a decoder decodes the content into unencoded form. Codebooks are utilized and accessed by an encoder and decoder of a sending/receiving station pair.

25 Claims, 3 Drawing Sheets

APPARATUS, AND ASSOCIATED METHOD, FOR COMMUNICATING CONTENT IN A BANDWIDTH-CONSTRAINED COMMUNICATION SYSTEM

CROSS-REFERENCE TO RELATED APPLICATIONS

The present invention claims the priority of provisional patent Application No. 60/287,254, filed on Apr. 27, 2001, the contents of which are incorporated herein.

The present invention relates generally to a manner by which to communicate data, such as a vector graphic, in a bandwidth-constrained communication system. More particularly, the present invention relates to apparatus, and an associated method, by which to compress content, such as the vector graphic, at a sending station, prior to communication upon the bandwidth-constrained channel, to a receiving station. Further, the present invention relates to apparatus, and an associated method, by which to decompress the content, once received at a receiving station.

By compressing the content prior to its communication upon the communication channel, the bandwidth required to communicate the data is reduced. Data compression is great enough to permit communication of animated vector graphics, or other content, in a cellular, or other bandwidth-constrained, communication system.

BACKGROUND OF THE INVENTION

A communication system operates to communicate data between a sending station and a receiving station. A communication channel connects the sending and receiving station together, and the data is communicated by the sending station upon the communication channel to the receiving station. If necessary, the data to be communicated by the sending station is converted into a form to permit its communication upon the communication channel. The informational content of the data is recovered, once communicated to the receiving station.

A large number of different types of communication systems have been developed and implemented to effectuate the communication of data between two or more sending and receiving stations.

A communication system is referred to as a radio communication system when the communication channel interconnecting the sending and receiving stations is defined upon a radio link extending therebetween. The radio link is defined upon a portion of the electromagnetic spectrum. Because a radio link is used upon which to define the communication channel rather than a wireline connection, a radio communication system is inherently mobile. A communication system that, instead, utilize a conventional wireline connection upon which to define the communication channel is typically of limited mobility due to the need to interconnect the sending and receiving stations by way of the conventional, wireline connections.

An exemplary type of radio communication system is a cellular communication system. Cellular communication systems have achieved wide levels of usage and have been installed throughout large geographical areas of the world. Successive generations of cellular communication systems have been developed and implemented. Succeeding ones of the generations of communication systems incorporate advancements in communication technologies.

Reference is commonly made to at least three generations of cellular communication systems. So-called, first-generation cellular communication systems were first-implemented and generally utilized analog modulation techniques. An AMPS (advanced mobile phone service) cellular communication system is exemplary of a first-generation cellular communication system. A so-called, second-generation cellular communication system typically refers to a cellular communication system that utilizes a digital, multiple-access communication scheme. Second-generation systems, in contrast to first-generation systems, generally offer higher-capacity systems that provide for at least low-rate data services. A GSM (global system for mobile communications), a TDMA (time-division, multiple-access) system, a PDC (Pacific digital cellular) system and a CDMA1 (code-division, multiple-access) system are all exemplary of second-generation, cellular communication systems. So-called, third-generation communication systems are presently being developed. Third-generation systems also utilize digital communication techniques and provide for different service classes of communication services. A WCDMA (wide band, code-division, multiple-access) system, an EDGE (enhanced data rate for GSM evolution) system, and a CDMA-2000 (code-division, multiple-access 2000) system are all exemplary of third-generation systems. And, successor-generation systems are additionally under development.

Cellular communication systems, as well as other types of communication systems, are bandwidth-constrained. That is to say, the bandwidth available upon which to define communication channels upon which to communicate data is limited. The limited availability of the bandwidth limits the amount of data that can be communicated during operation of the communication system. The only manner by which to increase the amount of data that can be communicated is to communicate the data more efficiently.

Compression, and corresponding decompression, techniques are proposed by which to compress the data into more efficient form prior to its communication upon a communication channel and, subsequently, to be decompressed to recover thereafter the informational content of the data.

While data that is to be communicated pursuant to new-generation cellular communication systems, as well as other types of communication systems, is representative of many different types of information, data forming vector graphics are exemplary of data that might need to be communicated pursuant to a communication session to effectuate a communication service. A vector graphic is data-intensive representation. A compression technique by which to compress a vector graphic, as well as other types of data, would advantageously facilitate improved communications in a cellular, or other, communication system.

It is in light of this background information related to the communication of data in a cellular radio, or other, communication system that the significant improvements of the present invention have evolved.

SUMMARY OF THE INVENTION

The present invention, accordingly, advantageously provides apparatus, and an associated method, by which to communicate data, such as a vector graphic, in a bandwidth-constrained communication system.

Through operation of an embodiment of the present invention, a manner is provided by which to compress content, such as a vector graphic, at a sending station prior to communication upon the bandwidth-constrained channel, to a receiving station. Also through operation of an embodiment of the present invention, a manner is provided by which to decompress the content once communicated to a receiving station.

The bandwidth required to communicate the data upon the communication channel is reduced as the content that is to be communicated is compressed prior to its communication upon the communication channel. When used in a data-intensive communication application, such as a multi-media communication session in which animated vector graphics are communicated, the amount of data required to be communicated upon the communication channel to effectuate the communication service is reduced. Data compression is great enough to permit communication of animated vector graphics, or other content, in a cellular radio communication system, or other bandwidth-constrained communication system in manners to permit communication of Internet-related information at acceptable throughput rates.

In one aspect of the present invention, a vector graphics representation is compressed prior to its communication upon a communication channel. The vector graphics representation is formed, for example, of an SVG (scalable vector graphic) representation of an animated vector graphic. When the vector graphics representation is compressed pursuant to compression operations of an embodiment of the present invention, a compact representation of the vector graphics is formed that is more compact than conventional frame-based compression schemes. The flexibility, the fully object-based structure, and the maturity of SVG is combined with a compact representation.

In another aspect of the present invention, a codebook is formed that includes codewords of the declarations, properties, attributes, etcetera, that define a vector graphic. Each codeword is a representation of a corresponding element of the vector graphic. The codewords of the codebook are substituted for the corresponding elements of the vector graphic, and a succession of codewords form the compressed form of the vector graphic. Other types of data are analogously also coded utilizing an appropriately-configured codebook. Groups of the data are coded according to codewords contained in the codebook to form the data in the compressed form. Once compressed, the data is communicated upon the communication channel.

In a further aspect of the present invention, a dynamic codebook is provided. A dynamic codebook is a codebook whose codewords, or the interpretations thereof, change over time. The changes are dependent, for instance, upon the context forming the data that is to be communicated. The change is alternately, or collectively, also dependent upon previously-signaled data, or based upon other indicia.

In another aspect of the present invention, the codebook forms a conversion algorithm whose execution compresses content prior to its communication upon a communication channel. The codebook at which the conversion algorithm is defined forms a dynamic codebook when the conversion algorithm is changeable. The conversion algorithm, or its interpretation, changes over time, depending, for instance, on the content or previously-signaled data.

In another aspect of the present invention, an encoder operates to access the codebook when content, which is to be communicated, is delivered to the encoder. The content provided to the encoder is segregated into groups. When the content forms a vector graphic, the groups of the data form keywords. The encoder detects successive keywords and encodes the successive keywords by substituting therefor codewords contained at, or derived from, the codebook. The encoded content, formed of the encoded keywords, or other groups of data, are compressed relative to the content prior to encoding.

In these and other aspects, therefore, apparatus, and an associated method, is provided for a communication system in which content is communicated by a sending station. The content is formed of groups of data items. The content is compressed into compressed form to facilitate communication thereof, in compressed form, upon a communication channel. At least a first sending-station codebook is positioned at the sending station. The sending-station codebook contains a conversion mechanism. The conversion mechanism defines a manner by which to compress the content. An encoder is coupled to the at least the first sending-station codebook. The encoder is further coupled to receive the content to be communicated by the sending station. The encoder encodes at least a first selected group of data items of the content by accessing the conversion mechanism and encoding the at least the first selected group of data items according to the conversion mechanism to form a coded representation thereof. The coded representation is of a smaller length than the first selected group of data items prior to encoding thereof.

A more complete appreciation of the present invention and the scope thereof can be obtained from the accompanying drawings that are briefly summarized below, the detailed description of the presently preferred embodiments of the invention, and the appended claims.

DETAILED DESCRIPTION

Figure 1:
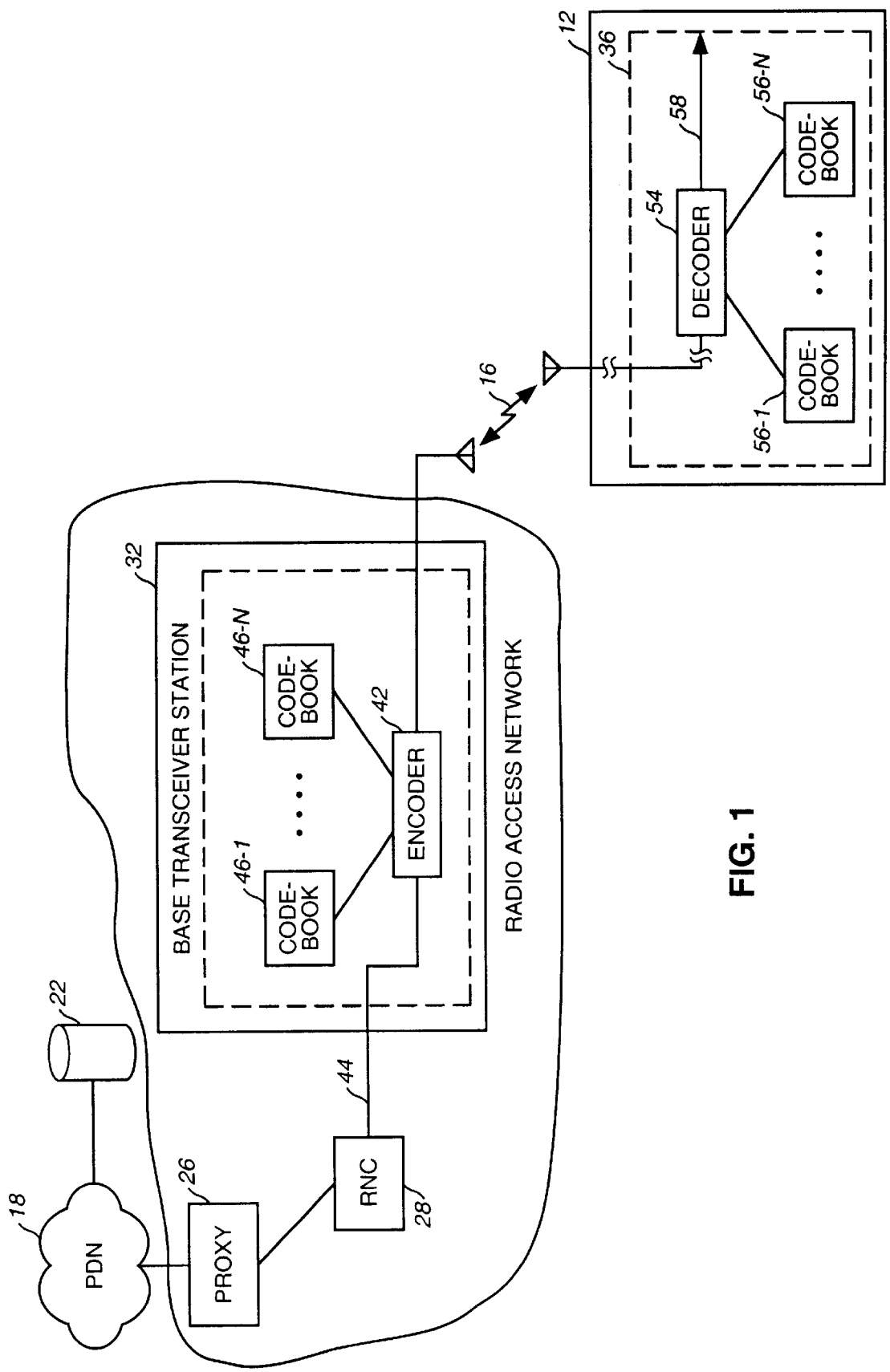
FIG. 1 illustrates a functional block diagram of a communication system in which an embodiment of the present invention is operable.

Referring first to FIG. 1, a communication system, shown generally at 10, provides for the effectuation of a communication service pursuant to a communication session with a mobile station, of which the mobile station 12 is representative. In the exemplary implementation, the mobile station 12 forms a "Web-enabled" communication device or is otherwise capable of at least receiving animated vector graphics. More generally, the mobile station is representative of any receiving station capable of receiving content formed of groups of bits. And, more generally, the communication system 10 is representative of any communication system in which content is communicated to a receiving station. Therefore, while the following description shall describe operation of an exemplary implementation of the present invention in which the receiving station forms the mobile station 12, the teachings of the present invention can analogously be implemented in other types of communication systems.

The communication system 10 also includes a network portion having a radio access network 14 that communicates data to, and receives data communicated from, the mobile station 12. Communication of data between the radio access network 14 and the mobile station is effectuated by way of communication channels defined upon radio links 16 formed between the radio access network and the mobile station.

The radio access network is connected to a packet data network (PDN) 18, such as the Internet. And, a data source/destination device 22 is connected to the packet data network. The device 24 forms, for instance, a computer server containing a database at which the animated vector graphics are stored or from which the vector graphics are formed. A communication path is formable between the device 22 and the mobile station 12 through the packet data network, the radio access network, and the radio link 16, thereby to permit the communication of data between the device and the mobile station. Communication of the data forming the vector graphics from the device 22 to the mobile station 12 us effectuated by way of the communication path, so-formed.

As noted previously, communication of vector graphics is bandwidth-consumptive. The bandwidth requirements constrain the rates at which the vector graphics can be communicated. Operation of an embodiment of the present invention compresses the data forming the vector graphics so that the data forming the vector graphics are communicated in compressed form. Once received, the data is decompressed to recover the informational content of the vector graphic.

The radio access network is here shown to include a proxy 26, a radio network controller (RNC) 28, and a base transceiver station (BTS) 32. The proxy 26 forms an interface between the radio access network and the packet data network. The radio network controller operates to control communications in, and through, the radio access network. And the base transceiver station operates to transceive data communicated upon the communication channels defined upon the radio link with the mobile station.

The base transceiver station further includes apparatus 36 of an embodiment of the present invention. The elements of the apparatus are functionally represented and can be implemented in any desired manner, such as by algorithms executable by processing circuitry. And, while the apparatus 36 is positioned, in the exemplary implementation, at the base transceiver station, the elements of the apparatus can be located elsewhere or distributed amongst more than one device.

The apparatus 36 includes an encoder 42 that is coupled by way of the line 44 to receive data first at the device 22, or elsewhere, that is to be communicated by way of the radio link 16 to the mobile station. The encoder is also coupled to one or more codebooks 46 that also form portions of the apparatus of an embodiment of the present invention. N codebooks 46-1 through 46-N are shown in the figure. The codebooks are selectably accessible by the encoder during operation of the apparatus to compress the content provided by way of the lines 44. Namely, the codebooks contain coding mechanisms by which to encode the content provided on the lines 44 to the encoder.

In one implementation, the codebook forms a directory in which groups of the data bits forming the content are indexed together with coded representations thereof. When a group of the data forming the content is applied to the encoder, the encoder accesses the codebook and the coded representation of the group. The encoder substitutes for the group a coded representation thereof. Successive groups of the content data are encoded by the encoder by successive accessing of the codebook and substitution of the coded values for the groups of the content data provided thereto on the line 44. The content, in compressed form, is generated on the lines 46.

The content, in the compressed form, is communicated by way of communication channels defined upon the radio link 16 to the mobile station.

The mobile station also includes apparatus 36 of an embodiment of the present invention. Here, the compressed content is decompressed by the apparatus 36, thereafter to permit recovery of the information contained in the content. The apparatus 36 is here coupled by way of the line 52 to receive indications of the compressed content, once received at the mobile station. The apparatus includes a decoder 54 to which the indications of the compressed content are provided. The decoder is coupled to one or more codebooks 56 that corresponds substantially identically with the codebooks 46. Here, N codebooks are represented.

The decoder 54 is operable generally reverse to that of operation of the encoder 42. That is, the decoder operates to decode successive groups of the coded content data provided thereto. With each group that is applied to the decoder, the decoder accesses an appropriate codebook. Responsive to the access of the conversion mechanism contained at the codebook, the group of the compressed content is substituted with the decompressed equivalent, thereby to recreate the decompressed content.

Figure 2:
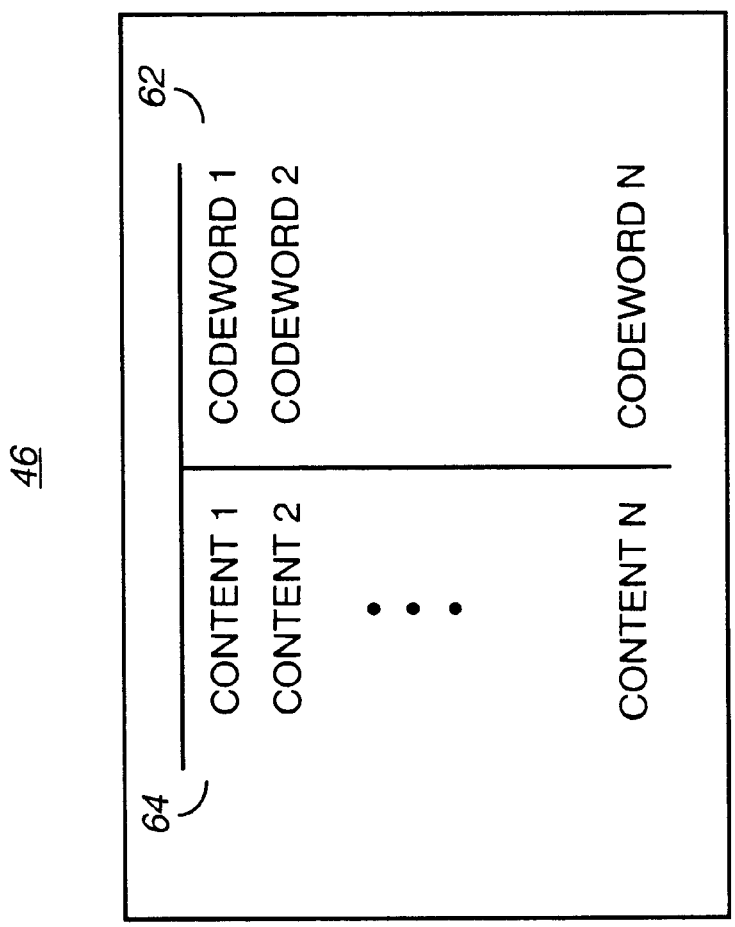
FIG. 2 illustrates a representation of a codebook forming a portion of an embodiment of the present invention.

FIG. 2 illustrates an exemplary codebook 46 of an embodiment of the present invention. The codebook 46 is substantially identical to a codebook 56, and the representation shown in the figure is also representative of a codebook 56. Here, the codebook includes a series of codewords indexed together with groups of content 64. When a group of content is to be encoded, an encoder accesses the codebook and indexes the codeword associated with the group of content that is to be encoded. The codeword is retrieved and substituted for the group of content. Decoding operations performed by the decoder 54 are analogously implemented by accessing the codebook to locate the codeword provided to the decoder. The decoder substitutes for the codeword the group of the content associated with the codeword. Successive accessing of the codebook responsive to successive application to the decoder of successive codewords causes the decoder to generate on the line 58 an unencoded representation of the content.

Figure 3:
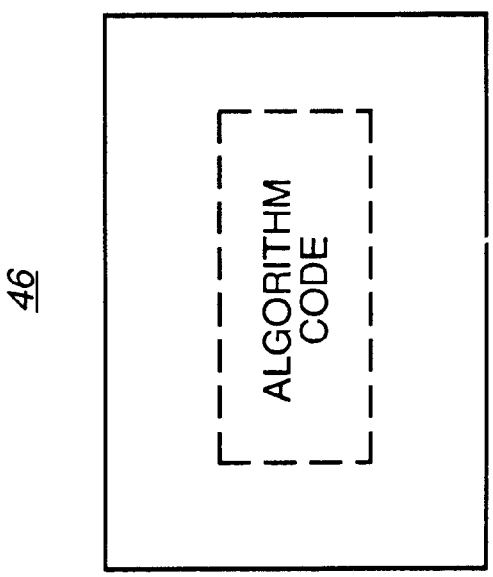
FIG. 3 also illustrates a representation of a codebook that forms a portion of the communication system shown in FIG. 1, hereof another embodiment of the present invention.

FIG. 3 illustrates a codebook of another implementation of the present invention. Here, the codebook is formed of a conversion algorithm that is accessed by the encoder 42 or decoder 54, as appropriate. The conversion algorithm acts upon input data to form converted, output data. When positioned at the encoder, the conversion algorithm converts groups of content data into encoded data. And, when positioned together with the decoder, the conversion algorithm operates to convert encoded, compressed data into unencoded, uncompressed form.

The codebooks, containing either type of conversion mechanisms, as well as others, can also be dynamically implemented. The values of the conversion mechanisms, or their interpretations, are changeable in a dynamic codebook. The changes are based, for instance, upon the context, or previously signaled data. Also, the context can be used to determine the particular codebook of more than one codebook, to be used for coding or decoding operations. In this regard, the codebook becomes a context-dependent, dynamic codebook. In other contexts, the encoder, or decoder, chooses a particular codebook from amongst possible alternatives and explicitly signals the selection of the codebook so that the decoder shall be aware of which codebook is to be used to decode content sent thereto. This forms a pre-signaled, dynamic codebook.

By way of an example, a context-dependent, a dynamic codebook can be used to communicate a typical vector graphics representation. Such a representation is heavily structured in that a stringent constraint is imposed on the keywords, e.g., declarations, properties, etc., that can be used in each context. Utilization of the context-dependent, dynamic codebook exploits the constraints. Within each context, codewords are assigned only to keywords that are allowed in that particular context. This results in a much shorter list of codewords, and the lengths of the codewords are, as a result, shorter.

An XML-like vector graphics representation scheme is capable of representing shapes, such as lines, circles, and rectangles of various sizes, positions, and orientation. The representation scheme is able to group the shapes into named objects. This XML-like vector graphic scheme can be considered as a version of SVG (scalable vector graphics), a conventional vector graphics representation scheme. A sample representation in ASCII text is depicted as follows:

```
<vgraph>
    <group name="firstObject">
        <circle cx="10" cy="15" radius="8"/>
        <line xl="10" yl="15" x2="18" y2="15"/>
        <rectangle x="2" y="20" width="15" height="4"/>
    </group>
    <group name="secondObject">
        <rectangle x="212" y="305" width="105" height="40"/>
        <line xl ="420" yl="300" x2="280" y2="5"/>
    <group>
    <rectangle x="27" y="29" width="5" height="15"/>
</vgraph>
```

Following the <vgraph> keyword, representation enters the main body context. At this context, the allowed keywords are the following: <group, <rectangle, <line, <circle, and </vgraph>. So, there are only five possible keywords in this context. Imposing this into the codebook to be used in the main body context, each keyword can be represented in three bits. Note that the ASCII text based representation spends fifty-nine bits on the average, forty bits minimum for each keyword in main body context.

The context changes after each keyword. For example, upon encoding the <line keyword, the line attributes context is entered, and possible keywords consist of x1, x2, y1, y2, and />. Or similarly, upon encoding the <group keyword, group attributes context is entered, and the allowed keywords in this context are name and />.

An alternate dynamic codebook construction involves an explicitly signaled selection of a codebook from a predefined list of alternative codebooks. This construction facilitates reduction in the number of bits spent for the encoding of the attribute values. At a given scope, the encoder selects the codebook which can represent the attribute values within that scope using minimum number of bits.

Consider the encoding of the coordinate and size (radius, width, and height) values in the above example. A single codebook is provided, here and all the coordinate and size values are encoded using this codeobok. The codebook here represents the values as follows:

If the value is in the interval [0, 510], encode it by its nine-bit binary representation, and if the value is outside this interval, signal this by nine consecutive ones (i.e., nine-bit binary representation of 511), followed by sixteen-bit binary representation of the value.

Since there are twenty-three values to be coded, and each of these values are within the [0, 510] interval, a total of 23*9=207 bits would be used for representing the coordinates and the sizes.

As an alternative, two codebooks are employed: one the same as above, and another one using the interval [0, 30] and five-bit representation. Assume that the encoder is supposed to signal, using one bit, which codebook to use for each of the objects at the main body scope. For this example, there are three objects, two groups and a rectangle at the main body scope. Thus, the overhead of encoding which codebook to use is three bits, one bit per main body-scoped object. The encoder would use the second codebook (five-bit codebook) for the first group and for the rectangle, and the first codebook (nine-bit codebook) for the second group. The bit usage for representing the coordinates and sizes are as follows:

three bits for signaling the codebook selection;
5*11=55 bits for the values in the first group;
9*8=72 bits for the values in the second group; and
5*4=20 bits for the values in rectangle.

So, a total of 3+55+72+20=150 bits would be used for representing the coordinates and the sizes. In other words, utilization of two different codebooks brings a bitrate reduction of 25% over using a single codebook.

The pre-signaling of codebook selection can also be used to reduce the number of bits spent for encoding keywords. For example, if only a small subset of keywords is used within the scope of a particular object, pre-signaling of this subset will enable the use of a very compact codebook having codewords only for the keywords in this subset.

A very specific form of pre-signaled codebook utilization in vector graphics representation context is available in a proprietary compact representation method, known as "Flash." In the reported utilizations, the dynamic range of the values within an object is pre-signaled, which induces the use of the smallest fixed-length codebook that is capable of representing the values in that dynamic range. There are two shortcomings of this specific form: it cannot be applied to codebooks representing keywords (or in general non-numbers); and the presence of few outliers (i.e., values which are much smaller or much larger than the others) can impact the performance.

An embodiment of the present invention can be utilized to compress any vector graphics representation. An exemplary application is the compression of the SVG representation for animated vector graphics. And the following implementation of the invention when applied to the compression of SVG.

Here, the main body of the syntax consists of a series of element declarations, and is terminated by a "Done with Element Declarations" keyword. In the main body scope, the following four-bit codebook 46 is used:

| | |
|---|---|
| 0000 | path |
| 0001 | text |
| 0010 | rect |
| 0011 | circle |
| 0100 | ellipse |
| 0101 | line |
| 0110 | polyline |
| 0111 | polygon |
| 1000 | g |
| 1001 | use |
| 1010 | animate |
| 1011 | set |
| 1100 | animateMotion |
| 1101 | animateTransform |
| 1110 | RESERVED for future extensions |
| 1111 | DONE with element declarations |

Each of the element declarations start with one of the above keywords. Upon coding one of the above codewords, the context, or equivalent scope, is updated. For example, upon the occurrence of the codeword 0000, both encoder and decoder will know that a path declaration will follow, and set their context as path context. This will practically mean that the codebook will be updated, and for example the bit sequence 0000 will not anymore mean 'Path declaration starting'. The path context will stay active until the occurrence of 'Done with path declaration' keyword. Upon the occurrence of 'Done with path declaration' keyword, the context will switch back to main body.

A generic element declaration can also be used. A generic (graphical or container) element declaration consists of the following parts: four-bit element identifier. This is a codeword from the above codebook; optional attributes that include a configuration field which states which of the optional attributes will be included, followed by attribute values; and required attributes that do not require configuration data, e.g., the decoder knows that required attributes are included.

Additionally, element declarations are used for container elements, e.g., 'g'. Four consecutive ones state that the declaration of the contained elements has finished. And, animation element declarations are used for 'g'. Start with a one-bit indicator of whether there are (0) animation elements associated with the current element, or not "1". If this indicator is "1", then a five-bit configuration data is sent. The configuration data indicates whether each of the following animation elements exists: animate, set, animateMotion, animateColor, or animateTransform. Then, the existing animation elements are defined in order.

An exemplary path element declaration is represented, thereby, as follows: element identifier: 0000; optional attributes: CLASS, TRANSFORM, STYLE, ID; and required attributes: d (path data).

A transform attribute is represented as a sequence of {Type, Value(s)} pairs. The Type is a codeword which identifies the type of transform which will be set, and Value(s) is the type-specific representation of the value which quantifies the particular transform. The Type codewords are listed in Table 1.

TABLE 1

| | |
|---|---|
| 00 | Translate |
| 010 | Rotate |
| 011 | Scale |
| 100 | Matrix |
| 101 | SkewX |
| 110 | SkewY |
| 111 | DONE with transform |

The transform values are encoded as integers. The integers are then scaled by system's resolution factors to get the real-valued transform values. Some transform types have optional arguments. The optional arguments are preceded by a one-bit indicator whether the optional argument will be specified (1), or not (0).

The style attribute is represented as a sequence of [Property, Value(s)} pairs, where Property is a codeword which identifies the property which will be set, and Value(s) is the property-specific representation of the value(s) to which the property is being set. The Property codeword starts with a four-bit code which is to be interpreted according to Table 2.

TABLE 2

| | |
|---|---|
| 0000 | Fill |
| 0001 | Stroke |
| 0010 | Stroke-width |
| 0011 | Visibility |

TABLE 2-continued

| | |
|---|---|
| 0100 | Color |
| 0101 | Font |
| 0110 | Font-size |
| 0111 | Font-style |
| 1000 | Font-weight |
| 1001 | Direction |
| 1010 | Display |
| 1011 | Fill-rule |
| 1100 | Flood-color |
| 1101 | EXT |
| 1110 | Reserved |
| 1111 | DONE with style |

If the property to be defined is one of the properties listed in Table 2, the codeword consists of the associated four-bit code. Otherwise, the EXT codeword (1101) is generated, by a six-bit code to complete the codeword. The six-bit code is the ordinal of the property in the Property Index of a conventional SVG specification.

The number of bits following the property type depends on the property type, color depth, etc. For example, for a two-color, e.g., black and white, graphics, two bits follow the fill or stroke attributes. 00 denotes no fill (no stroke), 01 denotes current color, 10 denotes black, 11 denotes white.

Path data is expected to cover a major part of the total information contained in a typical SVG animation. Thus, efficient representation of the path data has a crucial importance. As a result of seeking high efficiency, path data representation is one of the most tricky parts in the design of the compression algorithm.

Path data starts with a seven-bit configuration header. This header, together with the additional configuration information that follows it, determines the codewords to be used in the representation. The configuration header consists of the following flags:

C1: 0 states that both absolute and relative coordinates is used. 1 states that only one coordinate type is used.

C2: 0 states that Z (closepath) is not used in the current path representation. 1 states that it is not used.

C3: 0 states that M (moveto) is not used in the current path representation. 1 states that it is used.

C4: 0 states that L is used, and is the only lineto command. 1 states that it is either not used, or there are other types of lineto commands as well, such as H and V.

C5: 0 states that L may not be used successively. 1 states that L may be used successively.

C6: 0 states that none of the curve commands (such as C, S, Q, T) are used. 1 states that at least one of them is used.

C7: 0 states that A (elliptical arc) is used in the current path representation. 1 states that it is not used.

The additional configuration data is sent conditionally, as follows:

A1:
  If(C1==1),
    one-bit indicator of whether absolute (0) or relative (1) coordinates are used.
  For each coordinate representation type, (see the subsection "Representation of Integers" for details of representation type)
    one-bit indicator of whether the coordinate representation code length will be defined (1) or the default code length (0), as defined by the global size attributes and configuration parameters, will be used. If this indicator is 1, four-bit representation of the code length (the same codebook will be used for representation of the angles).

A4:
 If (C4==1),
  two-bit indicator which is to be interpreted as follows:
   00: no lineto commands are used,
   01: L and H are used, (if there is only H, use this one)
   10: L and V are used, (if there is only V, use this one)
   11: L, H, and V are used, (if there is only H and V, use this one)

A6:
 If (C6==1)
  one-bit indicator which indicates whether C (cubic Bezier curve) is used (0) or not (1).
  one-bit indicator which indicates whether S (shorthand cubic Bezier curve) is used (0) or not (1).
  one-bit indicator which indicates whether Q (quadratic Bezier curve) is used (0) or not (1).
  one-bit indicator which indicates whether T (shorthand quadratic Bezier curve) is used (0) or not (1).

After the configuration, the path data continues as a sequence of {Command, Arguments} pairs. Most of the arguments are encoded by using the appropriate coordinate representation codebook. The exceptions are some flags, which are one-bit lengths.

The codebook for the commands is constructed by choosing the available commands from the following list. The first available command is assigned the first codeword, etc. The length of the codewords is a function of the total number D of the available commands. The codewords are allocated as would be allocated by a Huffman code for n equi-probable symbols. In case of tie-breaks, the commands occurring earlier in the codebook are assigned shorter codewords (in fact, this process does not require an explicit construction of Huffman codewords, and the implementation is much simpler than it seems). With this assignment, code lengths vary between $\lfloor \log_2 n \rfloor$ and $\lceil \log_2 n \rceil$.

List of commands: M, m, L1, L1, L2, L2, L3, L3, L4, L4, H, h, V, v, Z, C, c S, s, Q, q, T, t, A, a, DONE.
Where Ln denotes n successive lineto commands.
Example Command Codebook:
 Consider the following path data in SVG: d="M 64 42 11 5 M 88 42 11 5 M 76 48 L 76 45 M 73 55 h 7". For this path data, the command codebook is constructed as follows:
  Both absolute and relative coordinates are used; Z is not used; M is used; L and H are used; L is not used successively, no curves used; no elliptical arcs used. Thus, the commands in the codebook are as follows: {M, m, L1, L1, H, h, DONE}. The codewords for these commands are as follows:

| | |
|---|---|
| M: | 00 |
| M: | 010 |
| L1: | 011 |
| L1: | 100 |
| H: | 101 |
| h: | 110 |
| DONE: | 111 |

In the particular path data, M occurs four times, L1 two times, L1 one time, h one time, and DONE one time. Thus, for the representation of the commands in this path data, a total of 4*2+(2+1+1+1)*3=23 bits are spent.

Two different codebooks are used, depending on whether absolute or relative addressing is used. Each codebook is parameterized by a constant code length cl, as described in the subsection "Representation of Integers". The cl's are encoded once for the whole path, and used throughout.

The full encoding of the path data of the above example is considered as follows:
 d="M 64 42 1 1 5 M 88 42 1 1 5 M 76 48 L 76 45 M 73 55 h 7".
The configuration header is composed as follows:
Both absolute and relative coordinates are used, so C1=0,
Z is not used, so C2=1
M is used, so C3=0,
L and H are used, so C4=1,
L is not used successively, so C5=1,
No curves used, so C6=1,
No elliptical arcs used, so C7=1.
Thus, the configuration header is 01011111, a seven-bit length representation (7 bits).
Next, additional configuration data is composed:
For absolute addressing, we choose cl=7, which can represent the maximum absolute coordinate in the path, 88, in seven bits. To indicate this code length, 10111 is sent (five bits). First 1 indicates that a new cl is defined for absolute addressing, and the next four bits is the binary representation of cl=7.
 For relative addressing, we choose cl=4, which can represent the maximum relative coordinate in the path, 7, in four bits. To indicate this code length, 10100 is sent (five bits). First 1 indicates that a new cl is defined for relative addressing, and the next four bits is the binary representation of cl=4.
Since C4=1, a two-bit indicator which indicates that L and H are used, 01, is sent (two bits).
After this, {Command, Argument} pairs can be transmitted. We use the command codebook from the above example for encoding the commands. Absolute arguments are represented by seven-bit codewords, and relative arguments are represented by four-bit codewords. The encoding goes as follows:

| | | |
|---|---|---|
| M 64 42 | 00 (M), 1000000 (64), 0101010 (42) | 16 bits |
| 1 1 5 | 100 (L1), 1000 (1), 1100(5) | 11 bits |
| M 88 42 | 00 (M), 1011000 (88), 0101010 (42) | 16 bits |
| 1 1 5 | 100 (L1), 1000 (1), 1100(5) | 11 bits |
| M 76 48 | 00 (M), 1001100 (76), 0110000 (48) | 16 bits |
| L 76 45 | 011 (L1), 1001100 (76), 0101101(45) | 17 bits |
| M 73 55 | 00 (M), 1001001 (73), 0110111 (55) | 16 bits |
| h 7 | 110 (h), 1110 (7) | 7 bits |
| DONE | 111 (DONE) | 3 bits |

One hundred thirteen bits are spent for the {Command, Argument} pairs, and 19 bits for configuration. In total, the path data is encoded by 132 bits.

Consider the representation of a positive integer value val of unknown dynamic range, according to a codebook parameterized by a constant code length cl. This representation is used when val is known from the context to be a non-negative integer. The method of encoding is as follows:
 Each value val in the range [0, $2^{cl}-2$] is encoded by a cl-bit unsigned binary representation of val.
 If val is greater than $2^{cl}-2$, a codeword consisting of cl consecutive ones (cl-bit unsigned binary representation of $2^{cl}-1$) indicates this. Then, encoding iterates on val-$2^{cl}$+1. The iteration continues this way, until the residue is in the range [0, $2^{cl}-2$]. For example, the representation of val=9 by Codebook-4 is "1001". The representation of val=18 by Codebook-4 is "1111 0101".

In some contexts, it is useful to signal the value of cl explicitly. In these cases, the value of cl is represented as follows:

First, there is a one-bit indicator of whether the cl to be used is equal to the default cl (0), as defined by the global size attributes, configuration parameters, and mode of representation; or it is different (1) than the default cl. If this indicator bit is 1, a four-bit representation of cl follows (practically, cl cannot be larger than fourteen. A value of fifteen is reserved for extensions).

When the viewport size is less than or equal to 256×256, the default cl is eight for the absolute mode of representation. (This mode is the main mode of representation, and used everywhere except when a relative coordinate value is being represented.)

In relative mode of representation, the default cl value is four. In this mode, an offset of $2^{cl-1}-1$ is added to val before representation. So, for default cl, val+7 is encoded instead of val. This mode is useful in encoding possibly negative numbers.

A nonnegative integer of unknown upper bound is represented by sending the code length cl first, and then using codebook-cl for the representation of the nonnegative integer.

For example, in absolute mode, val=129 can be represented by "0 10000001" (nine bits); val=6 by "1 0011 110" (eight bits) or by "0 00000110" (nine bits); and val=265 by "1 1001 000001010" (fourteen bits) or by "0 11111111 00001010 (seventeen bits).

The representation of an integer value val of unknown dynamic range, according to a codebook parameterized by a constant code length cl. The method of encoding is as follows: each value val in the range $[0, 2^{cl}-2]$ is encoded by a cl-bit unsigned binary representation of val. If val is outside this interval, a codeword consisting of cl consecutive ones (cl-bit unsigned binary representation of $2^{cl}-1$) indicates this. Then, one-bit representation of whether val is less (0) than 0, or it is greater (1) than $2^{cl}-2$ follows. If it is less than 0, 1-val is encoded as a positive integer via Codebook-cl. Otherwise, val-$2^{cl}$ is encoded as a nonnegative integer via Codebook-cl.

An integer of unknown dynamic range is represented by sending the code length cl first, and then using codebook-cl for the representation of the integer. For example, in absolute mode, (default cl=8), val=129 can be represented by "0 10000001" (nine bits); and val=-6 by "1 0011 111 0 110" (twelve bits).

In relative mode, (default cl=4), val=9 can be represented by "0 1111 1 0010" (ten bits) or "1 1001 10000" (ten bits); val=7 can be represented by "0 1110" (five bits); val=-6 by "0 0001" (five bits).

Figure 4:
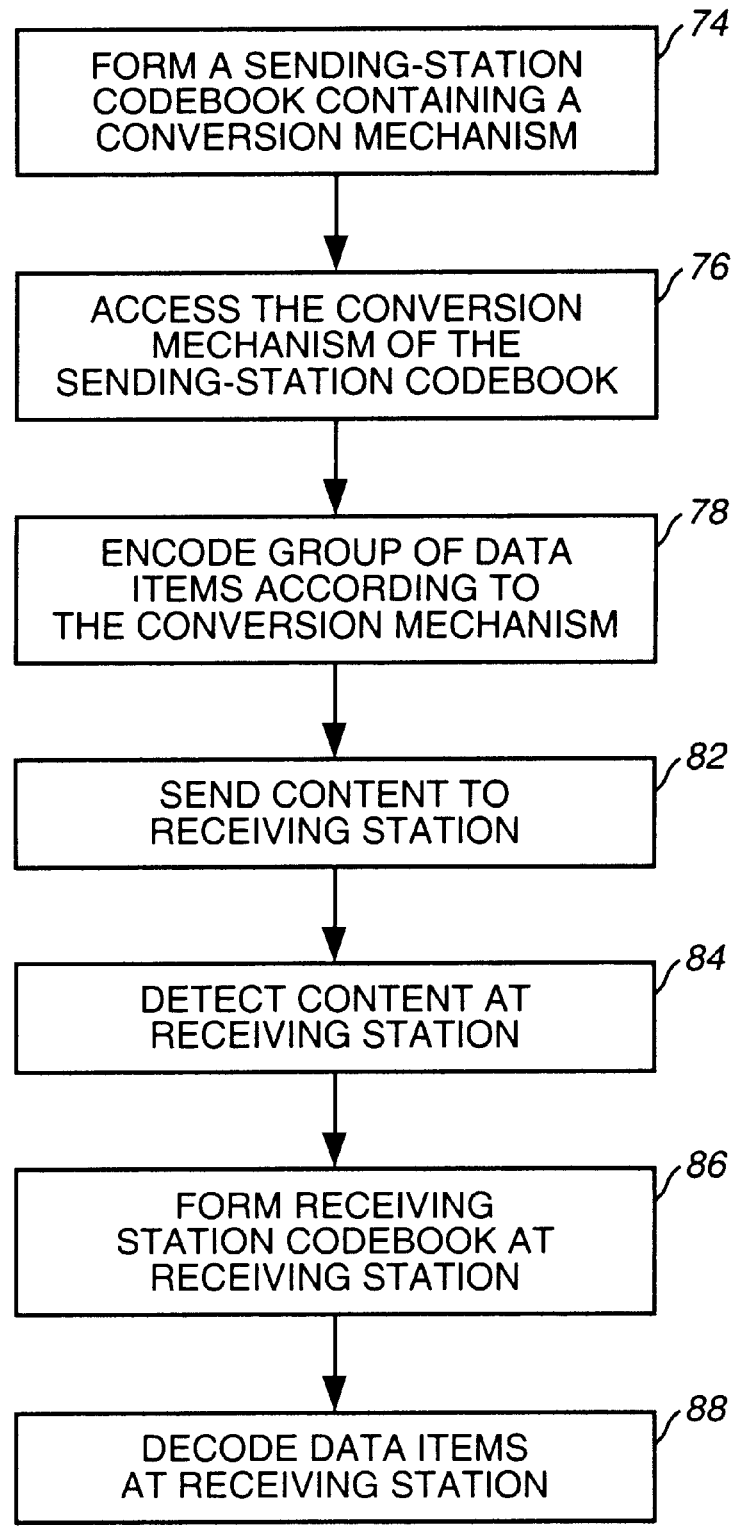
FIG. 4 illustrates a method flow diagram listing the method of operation of an embodiment of the present invention.

FIG. 4 illustrates a method, shown generally at 72, of an embodiment of the present invention. The method compresses content that is communicated by a sending station into compressed form. The content is formed of groups of data bits. When compressed into compressed form, communication thereof is facilitated upon a communication channel.

First, and as indicated by the block 74, at least a first sending-station codebook is formed. The first sending-station codebook contains a conversion mechanism that defines a manner by which to compress the content. Then, and as indicated by the block 76, the conversion mechanism of the first sending-station is accessed.

Then, and as indicated by the block 78, the at least the first selected group of data items are encoded according to the conversion mechanism to form a coded representation thereof. The coded representation is of a smaller length and the first selected group of data items prior to their encoding.

Thereafter, and as indicated by the blocks 82, the content is sent to a receiving station. And, as indicated by the block 84, the content is detected at the receiving station. Thereafter, and as indicated by the block 86, a first receiving-station codebook is formed at the receiving station. The first receiving-station codebook contains a conversion mechanism that defines a manner by which to decompress the data. And, as indicated by the block 88, the at least the first selected group of data items are decoded according to the conversion mechanism contained in the first receiving-station codebook.

Thereby, the content that is communicated is communicated in compressed form, reducing the bandwidth requirements to communicate the content upon a communication path interconnecting the sending and receiving stations, such as communication channels defined upon a radio link.

A more complete appreciation of the present invention and the scope thereof can be obtained from the accompanying drawings that are briefly summarized below, the following detailed description of the presently-preferred embodiments of the present invention, and the appended claims.

What is claimed is:

1. In a communication system in which content is communicated by a sending station, the content formed of groups of data items including vector graphics, an improvement of apparatus for compressing the content into compressed form to facilitate communication thereof, in compressed form, upon a communication channel, said apparatus comprising:

at least a first sending-station codebook positioned at the sending station, said sending-station codebook containing a conversion mechanism, the conversion mechanism defining a manner by which to compress the content;

an encoder coupled to said at least the first sending-station codebook and coupled to receive the content to be communicated by the sending station, said encoder for encoding at least a first selected group of data items of the content by accessing the conversion mechanism and encoding the at least the first selected group of data items according to the conversion mechanism to form a coded representation thereof, the coded representation of smaller length than the first selected group of data items prior to encoding thereof;

wherein the conversion mechanism contained by said at least the first codebook comprises values representative of at least selected groups of the data items forming the content together with coded representations thereof; and wherein said encoder encodes the at least the first selected group of data items by substituting therefor the coded representations thereof contained at said codebook and indexed together with the values representative of a corresponding selected group of the data items.

2. The apparatus of claim 1 wherein the conversion mechanism contained at said at least the first codebook comprises a conversion algorithm and processing circuitry at which the conversion algorithm is executable, the conversion algorithm defining a manner by which to convert at least selected ones of the selected groups of the data items forming the content.

3. The apparatus of claim 2 wherein said encoder encodes the at least the first selected group of data by accessing the conversion algorithm contained at said codebook and causing execution thereof.

4. The apparatus of claim 1 wherein the content comprises a vector graphic, wherein the groups of data items comprise content items, and wherein the conversion mechanism contained at said first codebook defines a manner by which to compress at least selected ones of the content items.

5. The apparatus of claim 4 wherein said encoder encodes the content items according to the conversion mechanism, to form the coded representations the content items of the vector graphic.

6. In the communication system of claim 1 wherein the content communicated by the sending station is communicated upon a communication channel to a receiving station, a further improvement of apparatus for the receiving station for decompressing the content, once delivered to the receiving station, said apparatus comprising:

at least a first receiving-station codebook positioned at the receiving station, said receiving-station codebook also containing a conversion mechanism, the conversion mechanism contained at said first receiving-station codebook defining a manner by which to decompress the data, the conversion mechanism contained at said receiving-station codebook corresponding to, but reverse with that of, the conversion mechanism contained at said first sending-station.

7. The apparatus of claim 6 further comprising a decoder coupled to said at least first receiving-station codebook and coupled to receive indications of the content, once delivered to the receiving station in compressed form, said decoder for decoding the indications of at least the first selected group of the data items of the content, by accessing the conversion mechanism of said receiving-station codebook and decoding the indications of the at least the first selected group of the data items to form a decoded representation thereof.

8. The apparatus of claim 1 wherein said first sending-station codebook comprises a dynamically-configured conversion mechanism, the manner by which to compress the content dynamically selected.

9. The apparatus of claim 8 wherein dynamic configuration of said first sending-station codebook is responsive, at least in part, to the content that is to be communicated.

10. The apparatus of claim 8 wherein dynamic configuration of said first sending station codebook is responsive, at least in part, to previously-communicated content.

11. The apparatus of claim 1 wherein said at least first codebook comprises said first codebook and at least a second codebook.

12. The apparatus of claim 11 wherein said encoder is coupled at least selectably to each of said first and at least second codebooks, said encoder selectably operable to retrieve coded representations from at least a selected one of said first and at least second codebooks.

13. In a method for communicating in which content is communicated by a sending station, the content formed of groups of data items including vector graphics, an improvement of a method for compressing the content into compressed form to facilitate communication thereof, in compressed form, upon a communication channel, said method comprising:

forming at least a first sending-station codebook, the first sending-station codebook containing a conversion mechanism that defines a manner by which to compress the content;

by accessing the conversion mechanism of the first sending-station codebook formed during said operation of forming;

encoding the at least the first selected group of data items according to the conversion mechanism to form a coded representation thereof, the coded representation of smaller length than the first selected group of data items prior to encoding thereof;

sending the content, once encoded during said operation of encoding, to a receiving station;

detecting the content, once delivered to the receiving station;

forming at least a first receiving-station codebook at the receiving-station codebook at the receiving station, the first receiving-station codebook containing a conversion mechanism that defines a manner by which to decompress the data;

wherein the conversion mechanism forming part of the first sending station codebook formed during said operation of forming comprises a dynamically-configured conversion mechanism;

determining indicia associated with the content that is to be communicated and wherein the dynamically-configured conversion mechanism is of a configuration responsive, at least in part, to the content that is to be communicated; and determining indicia associated with previously-communicated content and wherein the dynamically-configured conversion mechanism is of a configuration responsive, at least in part, to the content that has been previously communicated.

14. The method of claim 13 wherein the conversion mechanism contained at the first receiving-station codebook corresponds to, but is reverse with that of, the conversion mechanism contained at the first sending-station.

15. The method of claim 13 further comprising the operation of:

decoding the at least the first selected group of data items according to the conversion mechanism contained at the first receiving-station codebook by accessing the conversion mechanism contained at the first receiving-station codebook and decoding the indications of the at least the first selected group of the data items.

16. The method of claim 13 wherein the communication system comprises a radio communication system, wherein the sending station comprises a first radio transceiver station and the receiving station comprises a second radio transceiver station, wherein the communication channel comprises a radio channel, and wherein said operation of forming the first receiving-station codebook comprises sending indicia defining the first receiving-station codebook fro the first radio transceiver station to the second radio transceiver station.

17. The method of claim 13 wherein the first codebook formed during said operation of forming the first sending-station codebook comprises values representative of at least selected groups of the data items forming the content together with coded representation thereof.

18. The method of claim 17 wherein said operation of encoding comprises the operation of substituting the coded representations of the at least the first selected group of data items therefor.

19. The method of claim 13 wherein the conversion mechanism contained at the first sending-station defines a manner by which to convert at least selected ones of the selected groups of the data items forming the content.

20. The method of claim 19 wherein the conversion mechanism comprises a conversion algorithm and wherein said operation of encoding comprises executing the conversion algorithm.

21. The method of claim 13 wherein the content comprises a vector graphic, wherein the groups of data items comprise content items, and wherein the conversion mechanism contained at the first sending-station codebook during said operation of forming defines a manner by which to comprise at least selected ones of the content items.

22. The method of claim 21 wherein said operation of encoding comprises encoding the content items according to the conversion mechanism to form the coded representations of the content items of the vector graphic.

23. The method of claim 13 wherein said operation of forming comprises forming the first sending-station codebook and at least a second, first sending-station codebook.

24. The method of claim 23 wherein said operation of encoding comprises retrieving coded representations from at least one of the first and at least second first sending-station codebooks.

25. In a communication system in which content is communicated by a sending station, the content formed of groups of data items including vector graphics, an improvement of apparatus for compressing the content into compressed form to facilitate communication thereof, in compressed form, upon a communication channel, said apparatus comprising:

at least a first sending-station codebook positioned at the sending station, said sending-station codebook containing a conversion mechanism, the conversion mechanism defining a manner by which to compress the content;

an encoder coupled to said at least the first sending-station codebook and coupled to receive the content to be communicated by the sending station, said encoder for encoding at least a first selected group of data items of the content by accessing the conversion mechanism and encoding the at least the first selected group of data items according to the conversion mechanism to form a coded representation thereof, the coded representation of smaller length than the first selected group of data items prior to encoding thereof;

wherein the conversion mechanism contained by said at least the first codebook comprises values representative of at least selected groups of the data items forming the content together with coded representations thereof;

wherein said encoder encodes the at least the first selected group of data items by substituting therefor the coded representations thereof contained at said codebook and indexed together with the values representative of a corresponding selected group of the data items;

wherein said first sending-station codebook comprises a dynamically-configured conversion mechanism, the manner by which to compress the content dynamically selected;

wherein dynamic configuration of said first sending-station codebook is responsive, at least in part, to the content that is to be communicated; and wherein dynamic configuration of said first sending station codebook is responsive, at least in part, to previously-communicated content.

* * * * *